(12) United States Patent
Iida

(10) Patent No.: US 9,941,861 B2
(45) Date of Patent: Apr. 10, 2018

(54) WIRELESS COMMUNICATION APPARATUS

(71) Applicant: SONY CORPORATION, Tokyo (JP)

(72) Inventor: Sachio Iida, Chiba (JP)

(73) Assignee: SONY CORPORATION, Tokyo (JP)

( * ) Notice: Subject to any disclaimer, the term of this patent is extended or adjusted under 35 U.S.C. 154(b) by 177 days.

(21) Appl. No.: 14/892,015

(22) PCT Filed: Aug. 5, 2014

(86) PCT No.: PCT/JP2014/070651
§ 371 (c)(1),
(2) Date: Nov. 18, 2015

(87) PCT Pub. No.: WO2015/029722
PCT Pub. Date: Mar. 5, 2015

(65) Prior Publication Data
US 2016/0105537 A1 Apr. 14, 2016

(30) Foreign Application Priority Data

Aug. 26, 2013 (JP) .................................. 2013-174602

(51) Int. Cl.
*H03H 11/34* (2006.01)
*H03H 7/00* (2006.01)
(Continued)

(52) U.S. Cl.
CPC .......... *H03H 11/344* (2013.01); *H03H 7/002* (2013.01); *H03H 11/42* (2013.01);
(Continued)

(58) Field of Classification Search
CPC ..... H04M 1/026; H03H 11/344; H03H 11/42; H04B 1/52; H04B 1/525; H04B 1/58; H04L 5/14
(Continued)

(56) References Cited

U.S. PATENT DOCUMENTS

2011/0299435 A1* 12/2011 Mikhemar ............... H04B 1/18
370/278

FOREIGN PATENT DOCUMENTS

| JP | S51-127648 | 11/1976 |
| JP | H08-204405 | 8/1996 |
| JP | H10-056304 | 2/1998 |

OTHER PUBLICATIONS

International Search Report dated Nov. 11, 2014 in PCT/JP14/70651 Filed Aug. 5, 2014.

* cited by examiner

*Primary Examiner* — Benny Lee
*Assistant Examiner* — Hafizur Rahman
(74) *Attorney, Agent, or Firm* — Oblon, McClelland, Maier & Neustadt, L.L.P.

(57) ABSTRACT

[Object] To propose a wireless communication apparatus capable of realizing separation of transmission signals and reception signals with a low power consumption and a small size.
[Solution] Provided is a wireless communication apparatus including: a gyrator that includes at least four terminals; a single-phase differential converter that mutually converts single-phase signals and differential signals; a low-noise differential amplifier that amplifies reception signals that the gyrator outputs; and a differential power amplifier that amplifies transmission signals to be output to the gyrator. The gyrator transmits signals from a first terminal and a second terminal in the direction of a third terminal and a fourth terminal. Any of the single-phase differential converter, the low-noise amplifier, and the power amplifier are connected to the first terminal and second terminal, the third terminal and fourth terminal, the first terminal and third terminal, and the second terminal and fourth terminal of the gyrator.

11 Claims, 11 Drawing Sheets

(51) Int. Cl.
*H03H 11/42* (2006.01)
*H04B 1/52* (2015.01)
*H04B 1/58* (2006.01)
*H04B 1/525* (2015.01)
*H04L 5/14* (2006.01)
*H04M 1/02* (2006.01)

(52) U.S. Cl.
CPC ............... *H04B 1/52* (2013.01); *H04B 1/525* (2013.01); *H04B 1/58* (2013.01); *H04L 5/14* (2013.01); *H04M 1/026* (2013.01)

(58) Field of Classification Search
USPC ....................................... 330/6; 333/24, 215
See application file for complete search history.

WIRELESS COMMUNICATION APPARATUS

TECHNICAL FIELD

The present disclosure relates to a wireless communication apparatus.

BACKGROUND ART

Full-duplex wireless transmission, in which transmission and reception can be simultaneously performed, includes the frequency division duplex (FDD) system that performs bidirectional transmission using different frequency bands for transmission and reception, and the time division duplex (TDD) system that uses the same frequency band for transmission and reception but divides the transmission and reception at a regular time interval and alternates between them. In Universal Mobile Telecommunication System (UMTS) Long Term Evolution (LTE), the cellular telephone standard, full-duplex wireless transmission by either the FDD system or the TDD system is used.

As a method of separating transmission signals and reception signals generally used in the RF front end of a UMTS LTE FDD transceiver, there is a system of connecting a power amplifier (PA) and a low-noise amplifier (LNA) with a duplexer. A duplexer is mainly manufactured using a surface acoustic wave (SAW) filter or the like in order to separate transmission signals and reception signals with a frequency-selective filter. Since the manufacturing process of a duplexer differs from that of a transceiver chip, a duplexer cannot be mounted within an integrated transceiver chip.

Another system is one that uses a circulator. A circulator is a something that makes the advancing direction of a signal one way. However, since a circulator utilizes the non-reversibility of phase rotation produced in a wave travelling in ferrite on which a DC magnetic field is impressed from outside, this also cannot be mounted in an integrated transceiver chip.

The same non-reversibility of ferrite can be realized using a gyrator circuit of an electronic circuit. By using a gyrator circuit, it is possible to implement the function of separating transmission signals and reception signals in an integrated circuit. For example, Patent Literature 1 discloses the gist of gyrator circuits functioning as a circulator in the case of satisfying predetermined conditions in a circuit in which they are cascade-connected with the same directionality in a loop.

CITATION LIST

Patent Literature

Patent Literature 1: JP S51-127648A

SUMMARY OF INVENTION

Technical Problem

In UMTS LTE FDD, which is the cellular telephone standard, multiple frequency bands are allocated around the world. When the number of frequency bands that the RF front end of a UMTS LTE FDD transceiver is compatible with increases, the number of duplexers that must be mounted in the transceiver also end up increasing in order to accommodate the increase in frequency bands. Since duplexers and circulators are manufactured using SAW filters and ferrite, it is not possible to mount them in the integrated transceiver, and so the increase in the mounting area and cost accompanying the increase in the number of duplexers becomes substantial.

Moreover, in the circulator disclosed in the aforementioned Patent Literature 1 in which three gyrator circuits are used, power consumption easily increases due to the use of three gyrator circuits, and the characteristic of signal separation easily deteriorates due to variations in the transconductance coefficient of the gyrator circuits.

Therefore, the present disclosure proposes a new and improved wireless communication apparatus capable of realizing separation of transmission signals and reception signals with a low power consumption and a small size.

Solution to Problem

According to the present disclosure, there is provided a wireless communication apparatus including: a gyrator that includes at least four terminals and that transmits signals in one direction; a single-phase differential converter that mutually converts single-phase signals and differential signals; a low-noise amplifier that amplifies reception signals that the gyrator outputs; and a power amplifier that amplifies transmission signals to be output to the gyrator. The gyrator transmits signals from a first terminal and a second terminal in the direction of a third terminal and a fourth terminal. Any of the single-phase differential converter, the low-noise amplifier, and the power amplifier are connected to the first terminal and second terminal, the third terminal and fourth terminal, the first terminal and third terminal, and the second terminal and fourth terminal of the gyrator.

Advantageous Effects of Invention

As mentioned above, according to the present disclosure, it is possible to propose a new and improved wireless communication apparatus capable of realizing separation of transmission signals and reception signals with low power consumption and a small size. Note that the effects described above are not necessarily limited, and along with or instead of the effects, any effect that is desired to be introduced in the present specification or other effects that can be expected from the present specification may be exhibited.

DESCRIPTION OF EMBODIMENTS

Hereinafter, a preferred embodiment of the present disclosure will be described in detail with reference to the appended drawings. Note that, in this specification and the drawings, elements that have substantially the same function and structure are denoted with the same reference signs, and repeated explanation is omitted.

The description will proceed in the following order.
1. Embodiment of Present Disclosure
 1.1 Principle of Gyrator Circuit
 1.2 Configuration Example of RF Front End
 1.3 Operation of RF Front End
 1.3.1 Analysis of Transmission Signals
 1.3.2 Analysis of Reception Signals
 1.4 Exemplary Embodiments
 1.4.1 First Exemplary Embodiment
 1.4.2 Second Exemplary Embodiment
 1.4.3 Third Exemplary Embodiment
 1.4.4 Fourth Exemplary Embodiment
 1.4.5 Fifth Exemplary Embodiment
2. Conclusion

1. EMBODIMENT OF PRESENT DISCLOSURE 1.1 Principle of Gyrator Circuit

Figure 1:
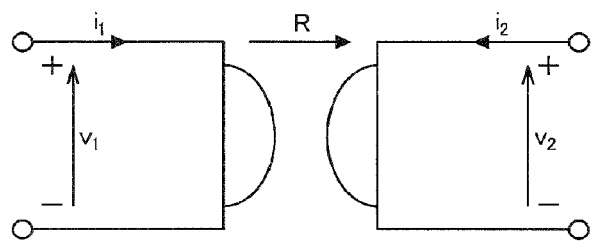
FIG. 1 is an explanatory drawing that shows the symbols of a gyrator circuit.
Figure 2:
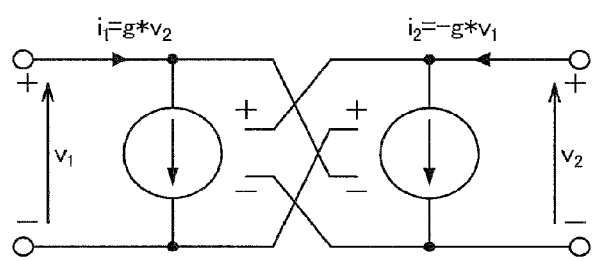
FIG. 2 is an explanatory drawing that shows the internal circuit of a gyrator circuit.

First, the principle of a gyrator circuit will be described. FIG. 1 is an explanatory drawing that shows the symbols of a gyrator circuit. Also, FIG. 2 is an explanatory drawing that shows the internal circuit of a gyrator circuit. Herinbelow, the principle of a gyrator circuit will be described using FIG. 1 and FIG. 2.

The arrow pointing from left to right in FIG. 1 shows the directionality of the gyrator circuit. Also, R in FIG. 1 denotes resistance. The internal circuit of the gyrator circuit shown in FIG. 2 has two current-controlled voltage sources gm1. Letting the transconductance coefficient of gm1 be g, the current i1 is g times the voltage v2, and the current i2 is minus g times the voltage v1 of the left-side terminal. When expressed with an admittance matrix considering a gyrator circuit as a two-terminal circuit, Equation 1 results.

[Math. 1]

$$\begin{pmatrix} i_1 \\ i_2 \end{pmatrix} = \begin{pmatrix} 0 & g \\ -g & 0 \end{pmatrix} \cdot \begin{pmatrix} v_1 \\ v_2 \end{pmatrix}$$ (Equation 1)

Figure 15:
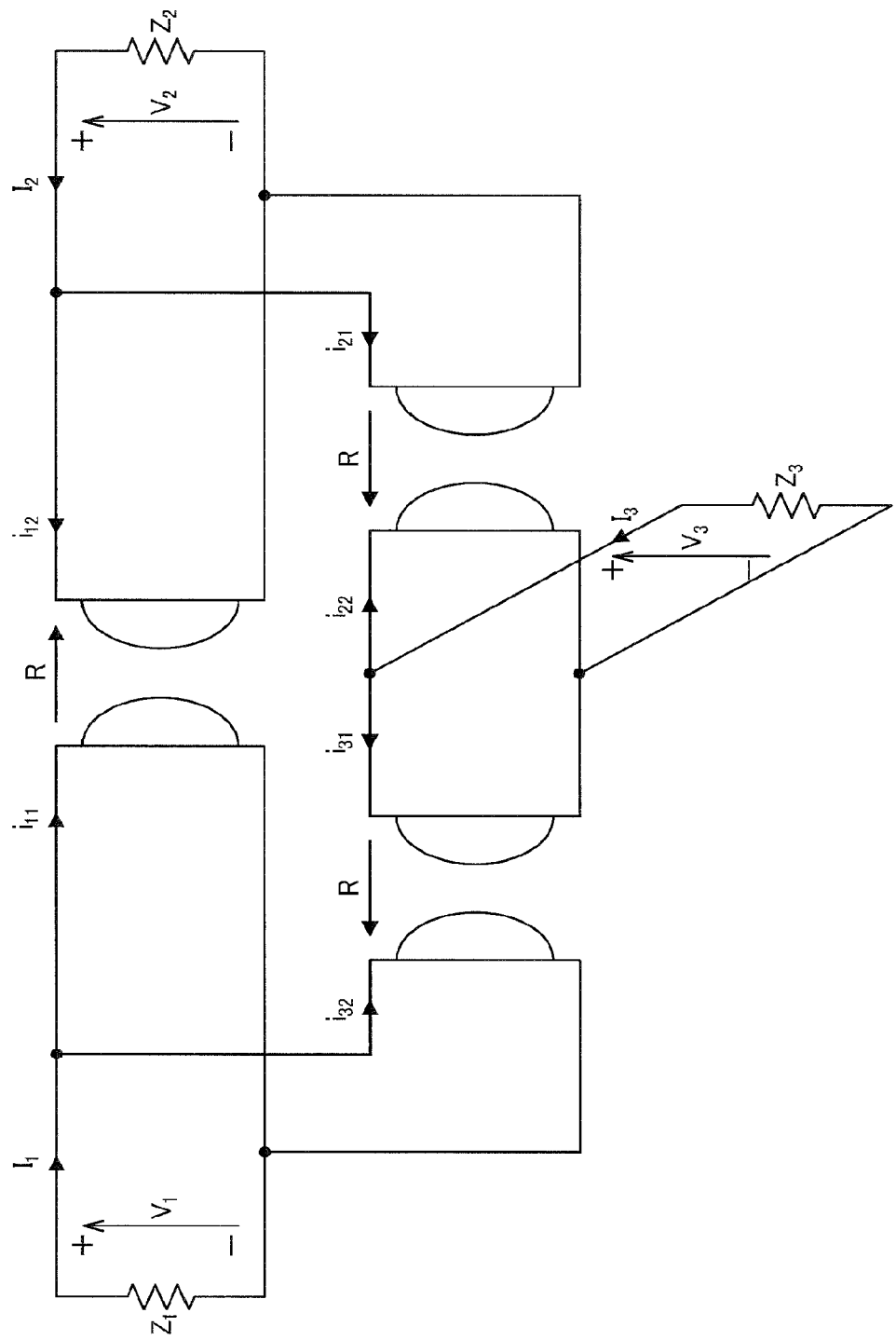
FIG. 15 is an explanatory drawing for explaining the conventional art.

As mentioned above, the implementation of a non-reversible characteristic is possible using gyrator circuits. FIG. 15 is a circuit disclosed in Patent Literature 1 in which gyrator circuits are cascade-connected with the same directionality in a loop. The gyrator circuits are constituted as shown in FIG. 15, and when the terminal impedances $Z_1$, $Z_2$, and $Z_3$ all equal the inverse (1/g) of the transconductance coefficient g of the current-controlled voltage sources, they function as a circulator.

An embodiment of the present disclosure described below is one that realizes separation of transmission signals and reception signals by minimizing the number of gyrators. The embodiment of the present disclosure described below is one that proposes realizing separation of transmission signals and reception signals with low power consumption and a small-sized circuit by minimizing the number of gyrators.

1.2 Configuration Example of RF Front End

Figure 3:
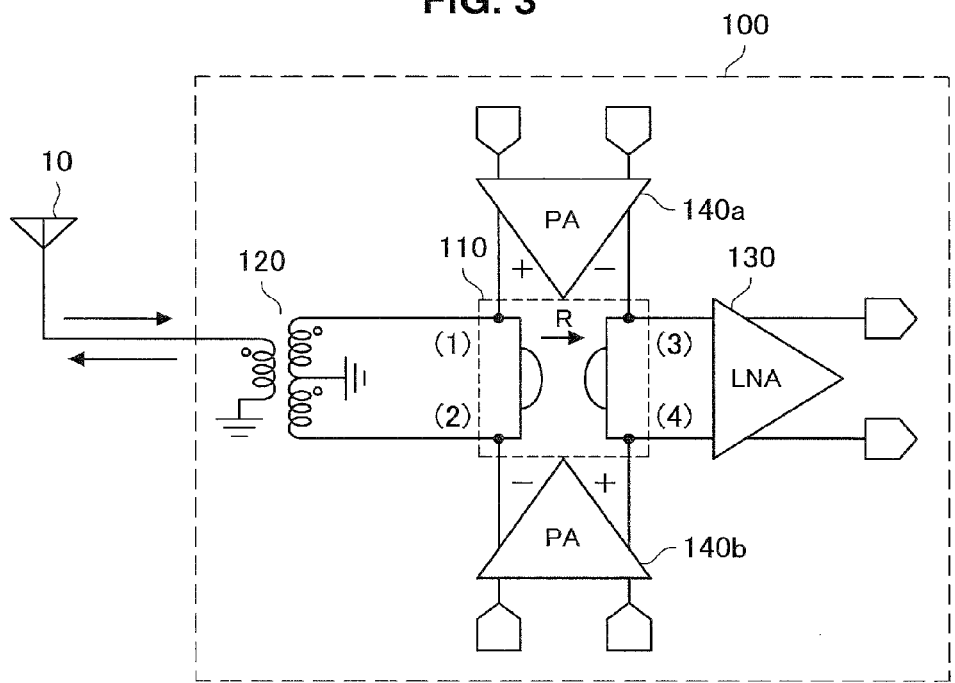
FIG. 3 is an explanatory drawing that shows a configuration example of the RF front end according to an embodiment of the present disclosure.

Next, a configuration example of a RF (Radio Frequency) front end according to the embodiment of the present disclosure will be described. FIG. 3 is an explanatory drawing that shows a configuration example of the RF front end according to the embodiment of the present disclosure. Hereinbelow, the configuration example of the RF front end according to the embodiment of the present disclosure will be described using FIG. 3.

As shown in FIG. 3, an RF front end 100 according to the embodiment of the present disclosure is configured to include a gyrator 110, a balun 120, a differential LNA (Low Noize Amplifier) 130, and differential PAs (Power Amplifiers) 140a and 140b. An antenna 10 that is connected to the RF front end 100 is also shown in FIG. 3.

The gyrator 110 is an electronic circuit that has a non-reversible characteristic, and has a function that separates the reception signals that the antenna 10 has received and the transmission signals that are transmitted from the antenna 10. The gyrator 110 according to this embodiment has four terminals. The two terminals on the left side of the gyrator 110 in the drawing are connected to the balun 120, while the two terminals on the right side are connected to the differential LNA 130. Also, the two terminals on the upper side of the gyrator 110 in the drawing are connected to the differential PA 140a, while the two terminals on the lower side are connected to the differential PA 140b.

Note that in the description below, the upper left, lower left, upper right, and lower right terminals of the gyrator 110 in the drawing are respectively the first terminal, second terminal, third terminal, and fourth terminal.

The balun 120 is a conversion element that converts single-phase signals into differential signals, and differential signals into single-phase signals. A single-phase reception signal that the antenna 10 has received is converted to a differential signal by the balun 120, and a transmission signal that is a differential signal output from the gyrator 110 is converted to a single-phase transmission signal by the balun 120.

The differential LNA 130 is an amplifier that amplifies and outputs reception signals sent from the antenna1 10 through the gyrator 110. In addition, the differential PAs 140a and 140b are amplifiers that amplify and output the transmission signals transmitted from the antenna1 10 through the gyrator 110.

The RF front end 100 according to this embodiment separates transmission signals and reception signals by one gyrator 110, as shown in FIG. 3. Moreover, in the RF front end 100 according to this embodiment, the four terminals of the gyrator 110 are connected to two different parties, and the two differential Pas 140*a* and 140*b* are connected to the gyrator 110, as shown in FIG. 3.

Hereinabove, a configuration example of the RF front end 100 according to the embodiment of the present disclosure was described using FIG. 3. Next, a description will be given of the RF front end 100 shown in FIG. 3 being able to separate transmission signals and reception signals.

1.3 Operation of RF Front End 1.3.1 Analysis of Transmission Signals

Figure 4:
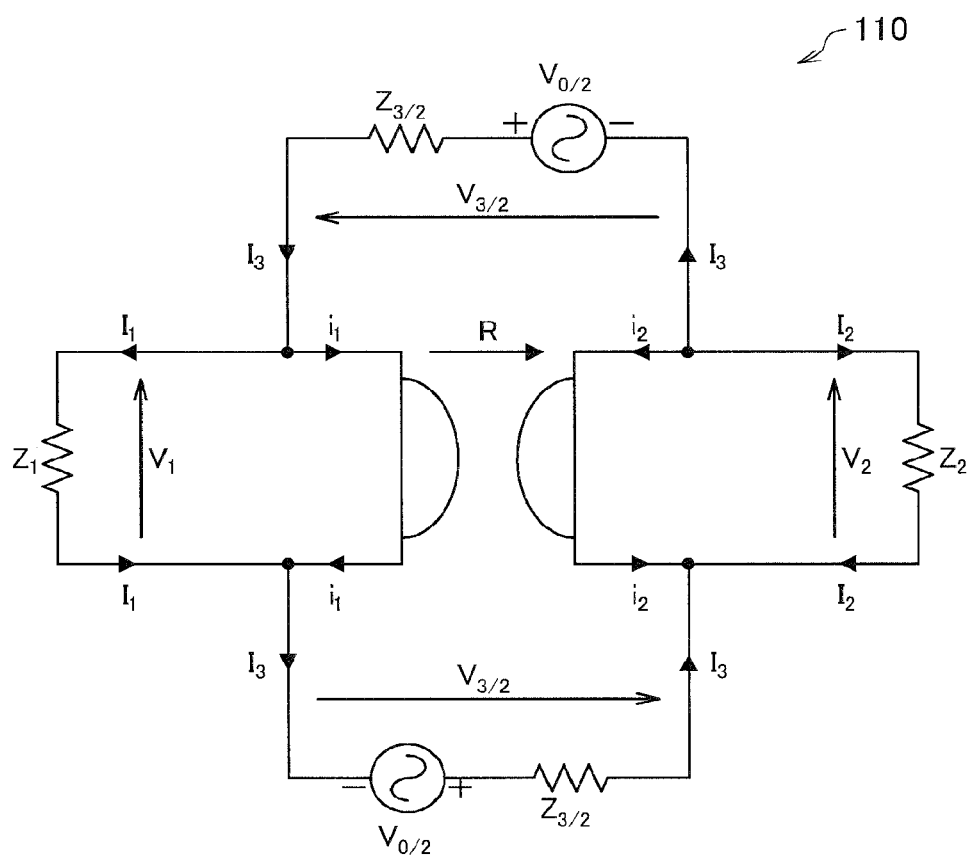
FIG. 4 is an explanatory drawing for explaining the operation when a transmission signal is supplied to the RF front end 100.

FIG. 4 is an explanatory drawing for explaining the operation when transmission signals are supplied to the RF front end 100. FIG. 4 shows the first terminal and second terminal of the gyrator 110 terminated with a resistor of impedance $Z_1$ instead of the balun 120, the third terminal and fourth terminal of the gyrator 110 terminated with a resistor of impedance $Z_2$ instead of the differential LNA 130, and the first terminal and third terminal and the second terminal and fourth terminal respectively terminated with a resistor of impedance $Z_3/2$ and a voltage source of open circuit output voltage $V_0/2$ of the differential PAs 140*a* and 140*b* instead of the differential PAs 140*a* and 140*b*.

Note that the polarities of the two voltage supplies are in the direction such that output voltages are summed in-phase when going around the surrounding voltages of the gyrator 110.

The relations of the following Equation 2 and Equation 3 are established between the voltages, currents and impedances shown in FIG. 4. Note that the voltage $V_3$ is the in-phase sum of the output voltages of the differential PAs 140*a* and 140*b*. Accordingly, the respective output voltages of the differential PAs 140*a* and 140*b* are $V_3/2$.

[Math. 2]

$$\left. \begin{array}{l} V_1 = I_1 Z_1 \\ V_2 = I_2 Z_2 \\ V_3 = V_0 - I_3 Z_3 = V_1 - V_2 \end{array} \right\} \quad \text{(Equation 2)}$$

[Math. 3]

$$\left. \begin{array}{l} I_1 = I_3 - i_1 \\ I_2 = -I_3 - i_2 \\ I_3 = \dfrac{V_0 - V_1 + V_2}{Z_3} \end{array} \right\} \quad \text{(Equation 3)}$$

Also, the relations of the following Equation 4 are established between the voltages and the currents of the gyrator 110. Note that g is the transconductance coefficient of the voltage-controlled current sources in the gyrator 110.

[Math. 4]

$$\left. \begin{array}{l} i_1 = gV_2 \\ i_2 = -gV_1 \end{array} \right\} \quad \text{(Equation 4)}$$

Accordingly, from Equations 2, 3, and 4, it is found that the following relations of Equation 5 are established.

[Math. 5]

$$V_1 = \left( \frac{V_0 - V_1 + V_2}{Z_3} - gV_2 \right) Z_1 \quad \text{(Equation 5)}$$
$$V_2 = \left( -\frac{V_0 - V_1 + V_2}{Z_3} + gV_1 \right) Z_2$$

Rearranging Equation 5 for each voltage results in the following Equation 6.

[Math. 6]

$$\left( \frac{Z_1}{Z_3} + 1 \right) V_1 + \left( gZ_1 - \frac{Z_1}{Z_3} \right) V_2 = \quad \text{(Equation 6)}$$
$$\frac{Z_1}{Z_3} V_0 - \left( \frac{Z_2}{Z_3} + gZ_2 \right) V_1 + \left( 1 + \frac{Z_2}{Z_3} \right) V_2 = -\frac{Z_2}{Z_3} V_0$$

Rewriting Equation 6 in a matrix results in Equation 7.

[Math. 7]

$$\begin{pmatrix} \frac{Z_1}{Z_3} + 1 & gZ_1 - \frac{Z_1}{Z_3} \\ -\frac{Z_2}{Z_3} - gZ_2 & 1 + \frac{Z_2}{Z_3} \end{pmatrix} \cdot \begin{pmatrix} V_1 \\ V_2 \end{pmatrix} = \begin{pmatrix} \frac{Z_1}{Z_3} \\ -\frac{Z_2}{Z_3} \end{pmatrix} \cdot V_0 \quad \text{(Equation 7)}$$

When the inverse matrix of the two-row, two-column matrix shown in the left side of Equation 7 is used, it is possible to find the voltage $V_1$ between the first terminal and second terminal of the gyrator 110 and the voltage $V_2$ between the third terminal and third terminal. Note that the voltage $V_3$ is a value found by subtracting the voltage $V_2$ from the voltage $V_1$ as shown in Equation 2.

[Math. 8]

$$\begin{pmatrix} V_1 \\ V_2 \end{pmatrix} = \begin{pmatrix} \frac{Z_1}{Z_3} + 1 & gZ_1 - \frac{Z_1}{Z_3} \\ -\frac{Z_2}{Z_3} - gZ_2 & 1 + \frac{Z_2}{Z_3} \end{pmatrix}^{-1} \begin{pmatrix} \frac{Z_1}{Z_3} \\ -\frac{Z_2}{Z_3} \end{pmatrix} \cdot V_0 \quad \text{(Equation 8)}$$

[Math. 9]

$$V_1 = \frac{Z_1(gZ_2 + 1)}{Z_1 + Z_2 + Z_3 + g^3 Z_1 Z_2 Z_2} \cdot V_0 \quad \text{(Equation 9)}$$
$$V_2 = \frac{Z_2(gZ_1 - 1)}{Z_0^2 Z_1 + Z_0^2 Z_2 + Z_0^2 Z_3 + Z_1 Z_2 Z_2} \cdot V_0$$
$$V_3 = \frac{Z_1 + Z_2}{Z_0^2 Z_1 + Z_0^2 Z_2 + Z_0^2 Z_3 + Z_1 Z_2 Z_2} \cdot V_0$$

Here, while the impedance $Z_1$ of the balun 120 is indefinite since it changes under the influence of the surrounding conditions of the antenna 10, the input impedance $Z_2$ of the differential LNA 130 and the output impedance $Z_3/2$ of the differential PAs 140*a* and 140*b* can be designed so as to satisfy the following Equation 10, that is, to be equal to the inverse of the transconductance coefficient g of the voltage-controlled current sources of the gyrator 110.

[Math. 10]

$$Z_2 = Z_3 = \frac{1}{g} \quad \text{(Equation 10)}$$

Under the conditions of this Equation 10, the aforementioned Equation 9 is simplified as the following Equation 11.

[Math. 11]

$$V_1 = \frac{V_0}{2} \cdot \frac{2gZ_1}{gZ_1 + 1} \quad \text{(Equation 11)}$$
$$V_2 = \frac{V_0}{2} \cdot \frac{gZ_1 - 1}{gZ_1 + 1}$$
$$V_3 = \frac{V_0}{2}$$

Accordingly, the voltage $V_3$ becomes $V_0/2$ as in Equation 11.

In the case of the terminal impedances $Z_1$, $Z_2$, $Z_3$ all being equal to $1/g$, it is evident that $V_1$ and $V_3$ of Equation 11 alike become $V_0/2$, and $V_2$ becomes 0. Accordingly, it is evident that the gyrator 110 transmits all the outputs from the differential PAs 140a and 140b to the balun 120, and does not transmit them to the differential LNA 130. Accordingly, the gyrator 110 having four terminals can assume the role of a circulator that transmits the outputs from the differential PAs 140a and 140b to the antenna 10, and does not transmit them to the differential LNA 130.

Hereinabove, the operation when transmission signals are supplied to the RF front end 100 was described using FIG. 4. Next, the operation when reception signals are supplied to the RF front end 100 will be described.

1.3.2 Analysis of Reception Signals

Figure 5:
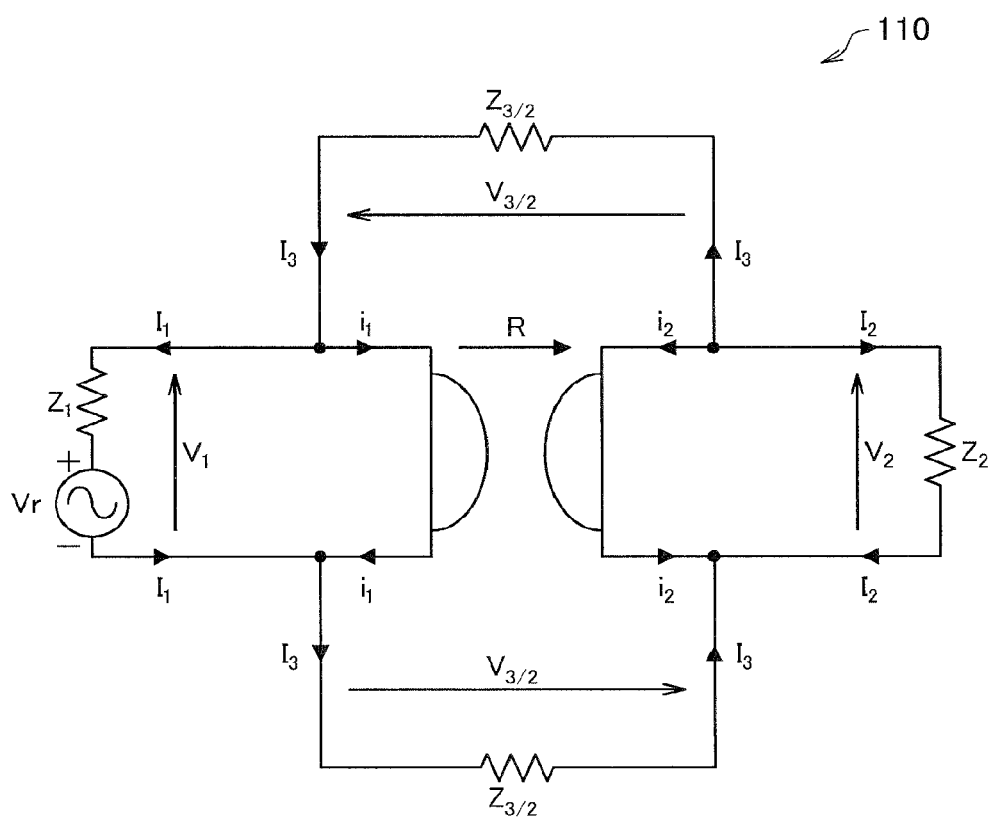
FIG. 5 is an explanatory drawing for explaining the operation when a reception signal is supplied to the RF front end 100.

FIG. 5 is an explanatory drawing for explaining the operation when a reception signal is supplied to the RF front end 100. FIG. 5 shows the first terminal and second terminal of the gyrator 110 terminated with a resistor of impedance $Z_1$ and an open circuit output voltage Vr of the reception signal connected in series instead of the balun 120, the third terminal and fourth terminal of the gyrator 110 terminated with a resistor of impedance $Z_2$ instead of the differential LNA 130, and the first terminal and third terminal and the second terminal and fourth terminal of the gyrator 110 respectively terminated with a resistor of impedance $Z_3/2$ instead of the differential PAs 140a and 140b.

The relations of the following Equation 12 and Equation 13 are established between the voltages, currents and impedances shown in FIG. 5. Note that the voltage $V_3$ is the in-phase sum of the output voltages of the differential PAs 140a and 140b. Accordingly, the respective output voltages of the differential PAs 140a and 140b are $V_3/2$.

[Math. 12]

$$V_1 = I_1 Z_1 + V_r \quad \text{(Equation 12)}$$
$$V_2 = I_2 Z_2$$
$$V_3 = -I_3 Z_3 = V_1 - V_2$$

[Math. 13]

$$I_1 = I_3 - i_1 \quad \text{(Equation 13)}$$
$$I_2 = -i_2 - I_3$$
$$I_3 = \frac{V_2 - V_1}{Z_3}$$

Also, since the relations of the aforementioned Equation 4 are established between the voltages and the currents of the gyrator 110, the relations of the following Equation 14 are established from equations 4, 12 and 13.

[Math. 14]

$$V_1 = \left(\frac{V_2 - V_1}{Z_3} - gV_2\right)Z_1 + V_r \quad \text{(Equation 14)}$$
$$V_2 = -\left(\frac{V_2 - V_1}{Z_3} - gV_1\right)Z_2$$

In the same manner as the aforementioned transmission signal, after rearranging Equation 14 for each voltage and transforming to a matrix equation, using the inverse matrix to solve for each voltage leads to the following Equation 15. Note that the voltage $V_3$ is a value found by subtracting the voltage $V_2$ from the voltage $V_1$ as shown in Equation 12.

[Math. 15]

$$V_1 = \frac{Z_2 + Z_3}{Z_1 + Z_2 + Z_3 + g^3 Z_1 Z_2 Z_2} \cdot V_r \quad \text{(Equation 15)}$$
$$V_2 = \frac{Z_2(1 + gZ_3)}{Z_1 + Z_2 + Z_3 + g^3 Z_1 Z_2 Z_2} \cdot V_r$$
$$V_3 = \frac{Z_3(1 - gZ_2)}{Z_1 + Z_2 + Z_3 + g^3 Z_1 Z_2 Z_2} \cdot V_r$$

In the same manner as the aforementioned transmission signal, when the impedances $Z_1$ and $Z_3$ are specified so as to satisfy Equation 10, the aforementioned Equation 15 is simplified in the manner of the following Equation 16. Since the voltage $V_3$ is a value found by subtracting the voltage $V_2$ from the voltage $V_1$ as shown in Equation 12, when the voltage $V_1$ and the voltage $V_2$ are equal, the voltage $V_3$ becomes 0.

[Math. 16]

$$V_1 = \frac{V_r}{2} \cdot \frac{2}{gZ_1 + 1} \quad \text{(Equation 16)}$$
$$V_2 = \frac{V_r}{2} \cdot \frac{2}{gZ_1 + 1}$$
$$V_3 = 0$$

In the case of the terminal impedances $Z_1$, $Z_2$, $Z_3$ all being equal to $1/g$, it is evident that $V_1$ and $V_2$ of Equation 16 alike become $V_r/2$, and $V_3$ becomes 0. Accordingly, it is evident that the gyrator 110 transmits all of the reception signals from the balun 120 to the differential LNA 130, and does not transmit them to the differential PAs 140a and 140b. Accordingly, the gyrator 110 having four terminals can assume the role of a circulator that transmits the outputs from the balun 120 to the differential LNA 130, and does not transmit them to the differential PAs 140a and 140b.

1.3.3 Improvement of Isolation Characteristic

Hereinabove, using FIG. 5 the operation when reception signals are supplied to the RF front end was described. In the above explanation, it was shown that when the terminal impedance $Z_1$ of the antenna 10 side is equal to $1/g$, the gyrator 110 can separate transmission signals and reception signals.

However, the impedance of the antenna 10 is normally not constant. Accordingly, it is not always the case that the terminal impedance $Z_1$ on the antenna 10 side can be made equal to $1/g$. If the impedance $Z_1$ is not equal to $1/g$, in the equation for $V_2$ of Equation 11, $(gZ_1-1)$ will not become 0. Accordingly, if the impedance $Z_1$ is not equal to $1/g$, $V_0$ remains in the equation for $V_2$ shown in Equation 11. That is, the isolation characteristic of the gyrator 110 used as a circulator deteriorates, and the transmission signals end up being sent to the differential LNA 130

Therefore, a method will be described of improving the isolation characteristic of the gyrator 110 by cancelling the $V_0$ component from $V_2$ using the relation of $V_1$ and $V_2$ of only transmission signals shown in Equation 11.

First, in order to distinguish transmission signals and reception signals, $V_1$ and $V_2$ of Equation 11 are made $V_{1TX}$ and $V_{2TX}$, and $V_1$ and $V_2$ of Equation 16 are made $V_{1RX}$ and $V_{2RX}$. Finding the condition for cancelling the transmission signals (that is, the condition of $V_{2TX}$ becoming 0) leads to Equation 17.

[Math. 17]

$$V'_{2TX} = V_{2TX} - \left(\frac{V_{2TX}}{V_{1TX}}\right)V_{1TX} = 0 \quad \text{(Equation 17)}$$

Also, if the relation of Equation 11 is used, the relation of the following
Equation 18 is established between $V_{1TX}$ and $V_{2TX}$.

[Math. 18]

$$\frac{V_{2TX}}{V_{1TX}} = \frac{gZ_1 - 1}{2gZ_1} \quad \text{(Equation 18)}$$

When the calculation result of this Equation 18 is stored and applied to the transmission signal shown in Equation 11 and the reception signal shown in Equation 16, $V_2$ becomes as the following Equation 19.

[Math. 19]

$$V'_2 = (V_{2TX} + V_{2RX}) - \left(\frac{V_{2TX}}{V_{1TX}}\right)(V_{1TX} + V_{1RX}) = \frac{V_r}{2gZ_1} \quad \text{(Equation 19)}$$

Accordingly, the RF front end 100 can eliminate the effect of $V_0$ on the equation of $V_2$ by application of Equation 19. Accordingly, during the separation of transmission signals and reception signals, the RF front end, by the application of Equation 19, cancels the transmissions signals to the antenna 10, and can obtain only the reception signals that the antenna 10 has received.

1.4 Exemplary Embodiments

1.4.1 First Exemplary Embodiment

In this way, the RF front end 100 according to the embodiment of the present disclosure, by using one gyrator 110, is capable of separating transmission signals and reception signals. Next, an exemplary embodiment of the RF front end 100 according to the embodiment of the present disclosure will be described.

Figure 6:
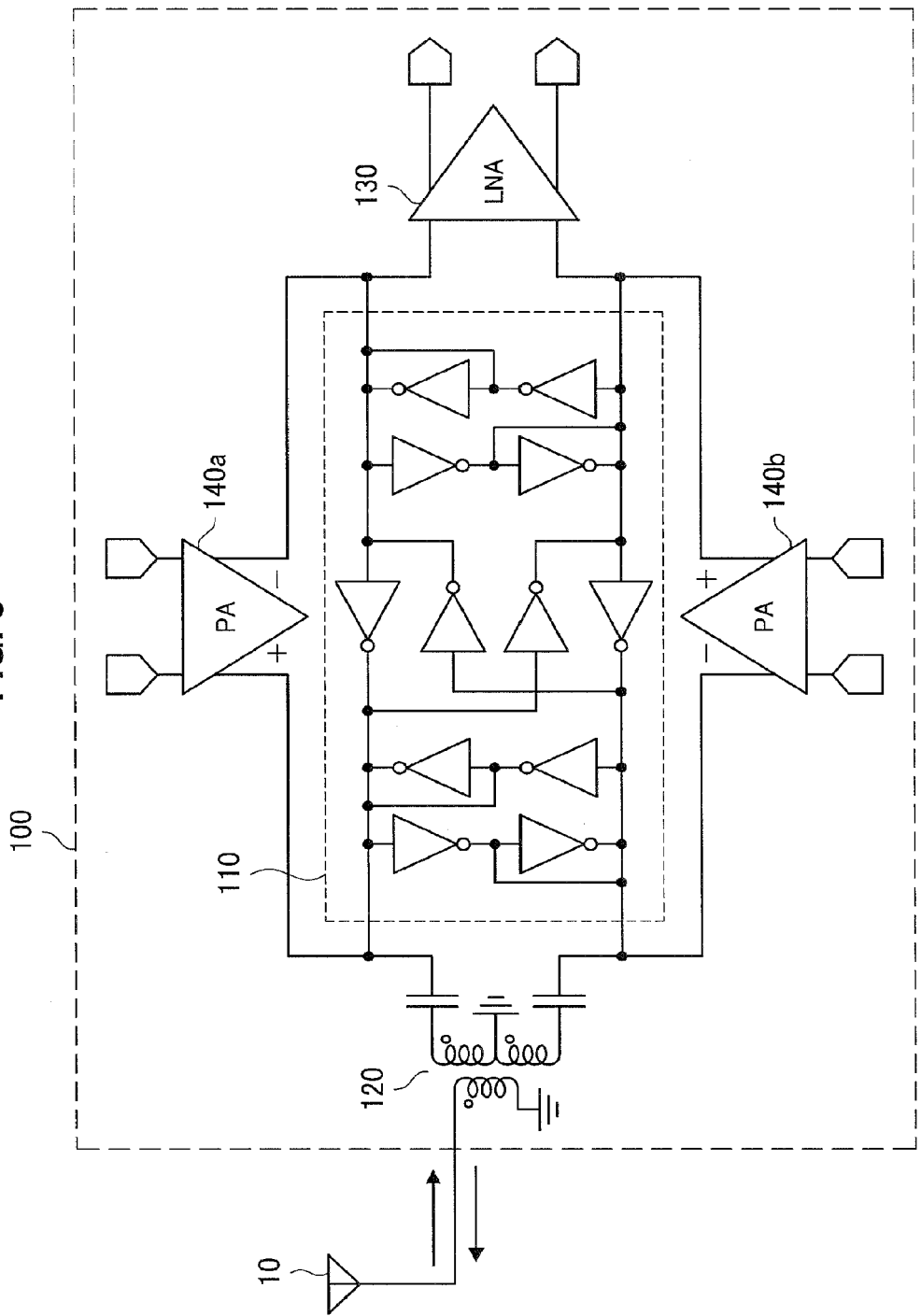
FIG. 6 is an explanatory drawing that shows the first exemplary embodiment of the embodiment of the present disclosure.

FIG. 6 is an explanatory drawing that shows the first exemplary embodiment of the embodiment of the present disclosure. Shown in FIG. 6 is an exemplary embodiment of the RF front end 100 in the case of applying two of the transconductor circuits disclosed in B. Nauta, "A CMOS transconductance-C filter technique for very high frequencies," IEEE Journal of Solid-State Circuits, vol. 27, no. 2, pp. 142-153 (February 1992) to the gyrator 110 included in the RF front end 100.

Figure 7:
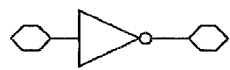
FIG. 7 is an explanatory drawing that shows the symbols of an inverter.

The transconductor circuit disclosed in the aforementioned literature is constituted from six inverters. Accordingly, the gyrator 110 shown in FIG. 6 is constituted with 12 inverters. FIG. 7 is an explanatory drawing that shows the symbols of an inverter, while FIG. 8 is an explanatory drawing that shows a circuit configuration example of an inverter.

Figure 8:
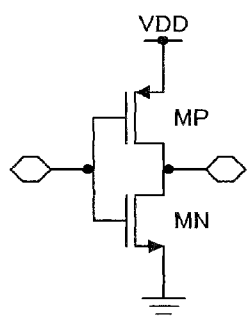
FIG. 8 is an explanatory drawing that shows the circuit configuration example of an inverter.

As shown in FIG. 8, the gates of the MOS PNP transistor MP and the MOS NPN transistor MN are connected to the input terminal, and the drains of the MOS PNP transistor MP and the MOS NPN transistor MN are connected to the output terminal. Since both the MOS PNP transistor MP and the MOS NPN transistor MN operate in the saturation region, the total of the transconductance coefficients of the two transistors is the transconductance coefficient of the inverter.

Figure 9:
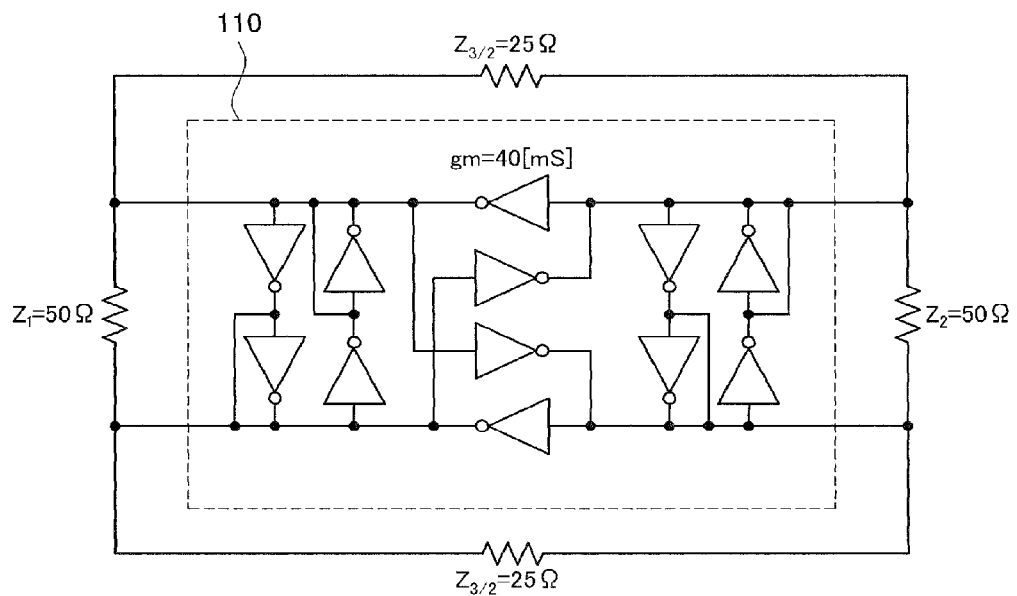
FIG. 9 is an explanatory drawing that shows the first exemplary embodiment of the embodiment of the present disclosure.

Note that since an inverter is a single-phase circuit, in order to make the transconductance coefficient of the differential mode of the gyrator 110 be g, the transconductance coefficient gm of the inverter is doubled. FIG. 9 is an explanatory drawing that shows the first exemplary embodiment of the embodiment of the present disclosure. For example, as shown in FIG. 9, the transconductance coefficient gm of an inverter in which any of the impedances $Z_1$, $Z_2$ and $Z_3$ is 50Ω is 40 mS since $Z_1=Z_2=Z_3=1/g=\frac{1}{2}$ gm.

1.4.2 Second Exemplary Embodiment

Figure 10:
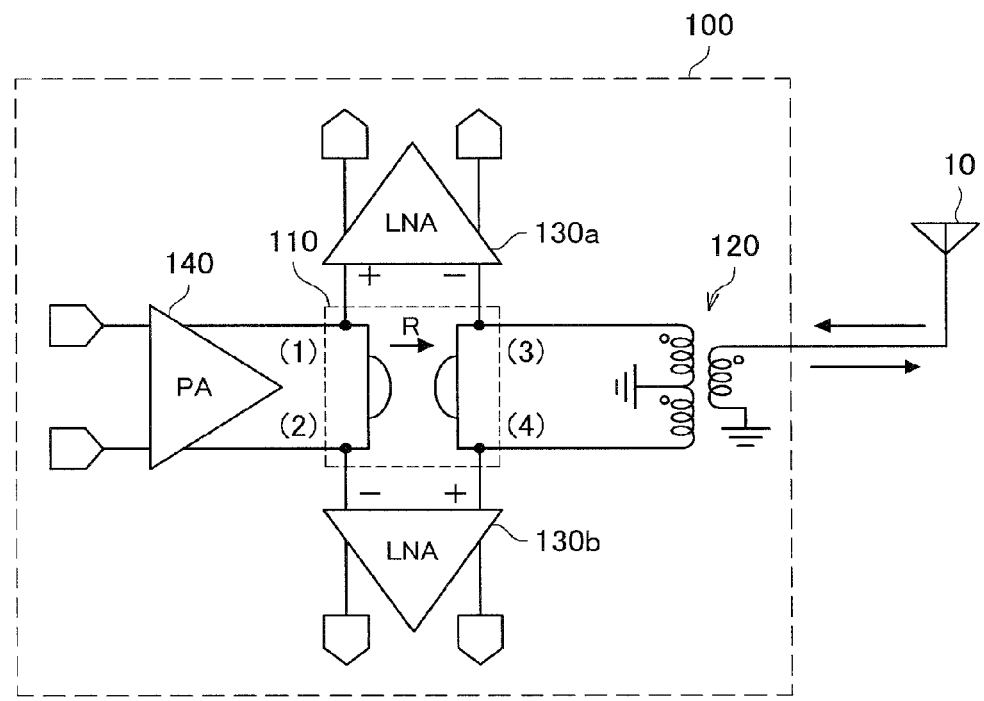
FIG. 10 is an explanatory drawing that shows the second exemplary embodiment of the embodiment of the present disclosure.

FIG. 10 is an explanatory drawing that shows the second exemplary embodiment of the embodiment of the present disclosure. In the first exemplary embodiment, the balun 120 was connected to the first terminal and second terminal of the gyrator 110, the differential LNA 130 to the third terminal and fourth terminal, and the differential PAs 140a and 140b to the first terminal and third terminal and the second terminal and fourth terminal, respectively. In that shown in FIG. 10, the positional relations of the balun, the differential LNA and the differential PAs are changed.

That is, in the second exemplary embodiment shown in FIG. 10, the differential PA 140 is connected to the first terminal and second terminal of the gyrator 110, the balun 120 to the third terminal and fourth terminal, and differential LNAs 130a and 130b to the first terminal and third terminal and the second terminal and fourth terminal, respectively. The transmission signals output from the differential PA 140 advance only to the antenna 10, and the reception signals input to the antenna 10 advance only to the differential LNAs 130a and 130b, whereby in the second exemplary embodiment of the RF front end 100 as well it is possible to separate the transmission signals and the reception signals.

1.4.3 Third Exemplary Embodiment

Figure 11:
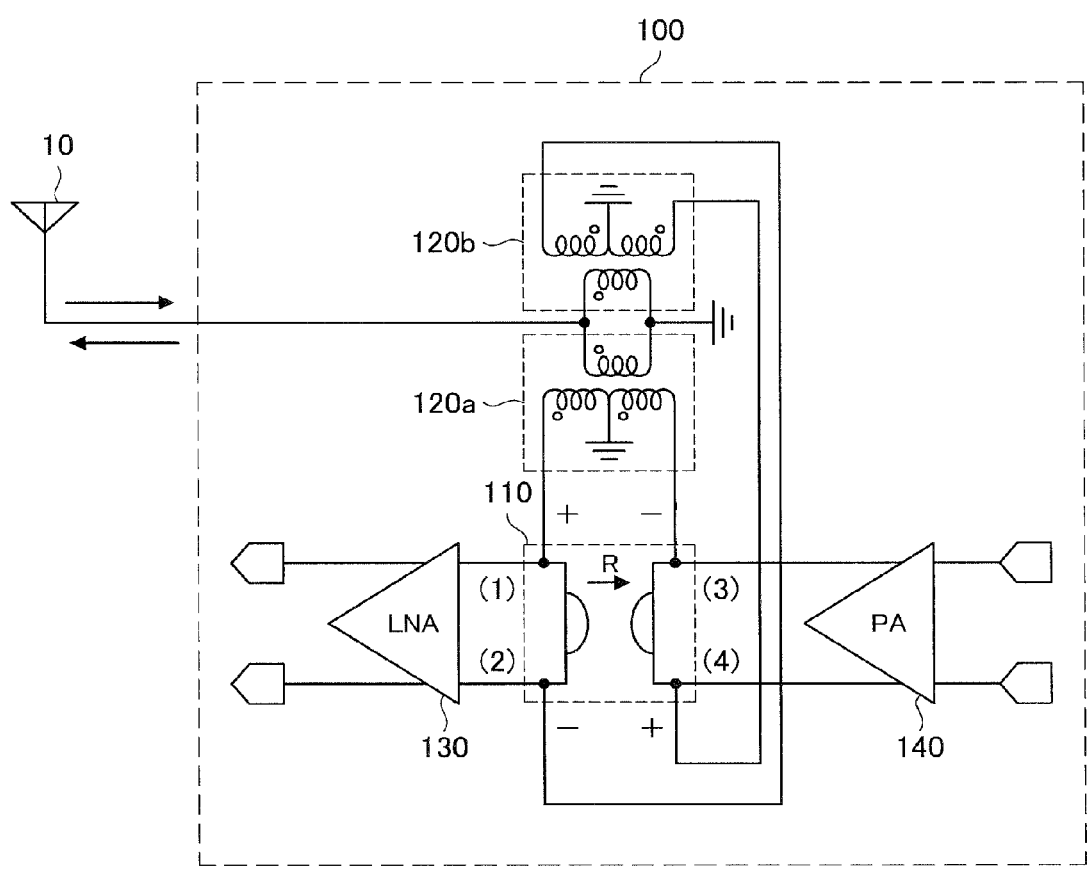
FIG. 11 is an explanatory drawing that shows the third exemplary embodiment of the embodiment of the present disclosure.

FIG. 11 is an explanatory drawing that shows the third exemplary embodiment of the embodiment of the present disclosure. In the third exemplary embodiment shown in FIG. 11, the differential LNA 130 is connected to the first terminal and second terminal of the gyrator 110, the differential PA 140 to the third terminal and fourth terminal, and the baluns 120a and 120b to the first terminal and third terminal and the second terminal and fourth terminal, respectively.

The transmission signals output from the differential PA 140 advance only to the antenna 10, and the reception signals input to the antenna 10 advance only to the differential LNA 130, whereby in the third exemplary embodiment of the RF front end 100 as well it is possible to separate the transmission signals and the reception signals.

1.4.4 Fourth Exemplary Embodiment

Figure 12:
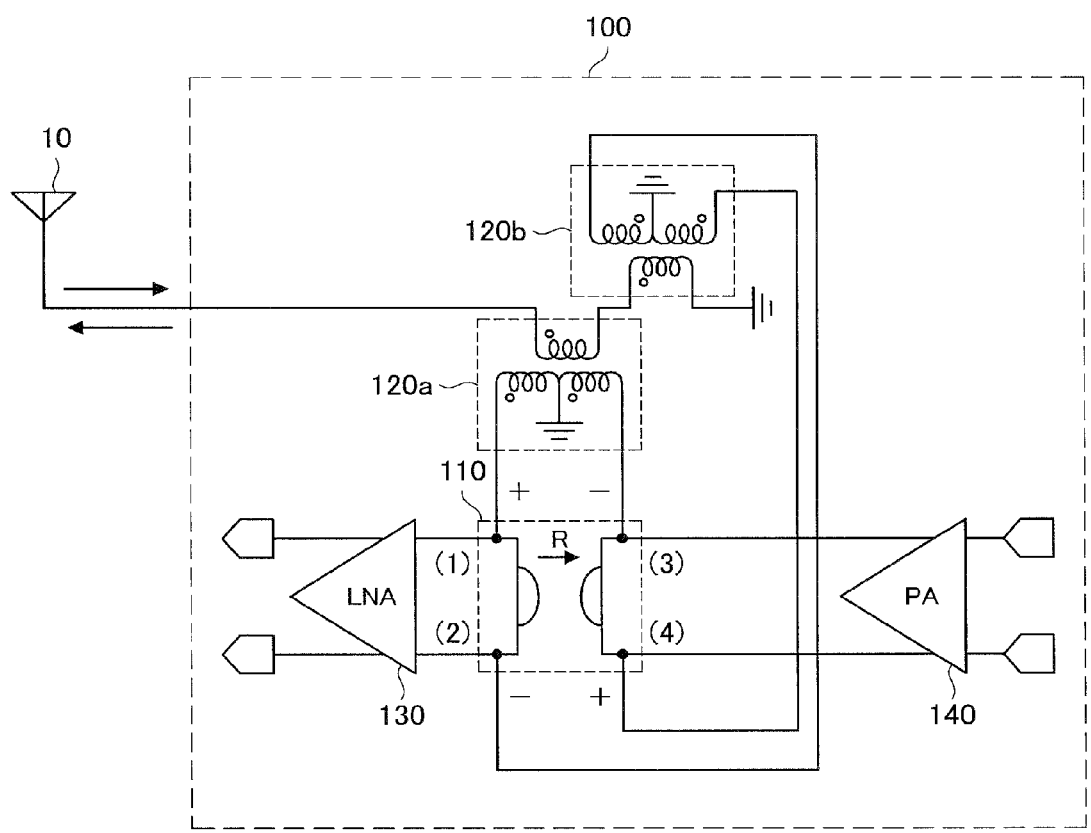
FIG. 12 is an explanatory drawing that shows the fourth exemplary embodiment of the embodiment of the present disclosure.

FIG. 12 is an explanatory drawing that shows the fourth exemplary embodiment of the embodiment of the present disclosure. In the fourth exemplary embodiment shown in FIG. 12, the differential LNA 130 is connected to the first terminal and second terminal of the gyrator 110, the differential PA 140 to the third terminal and fourth terminal, and the baluns 120a and 120b to the first terminal and third terminal and the second terminal and fourth terminal, respectively.

The example shown in FIG. 12 is the case of the baluns 120a and 120 being connected in series. Also in the case of the baluns 120a and 120b being connected in series as in FIG. 12, similarly to the case of the third exemplary embodiment, the transmission signals output from the differential PA 140 advance only to the antenna 10, and the reception signals input to the antenna 10 advance only to the differential LNA 130. Even in the case of the baluns 120a and 120b being connected in series in this way, it is possible to separate the transmission signals and the reception signals.

1.4.5 Fifth Exemplary Embodiment

As described in 1.3.3 Improvement of Isolation Characteristic, by the application of the aforementioned Equation 19, during the separation of transmission signals and reception signals, transmission signals to the antenna1 10 are cancelled and only reception signals that the antenna 10 has received are obtained. In the fifth embodiment, a constitution that separates transmission signals and reception signals by the application of Equation 19 will be described.

Figure 13:
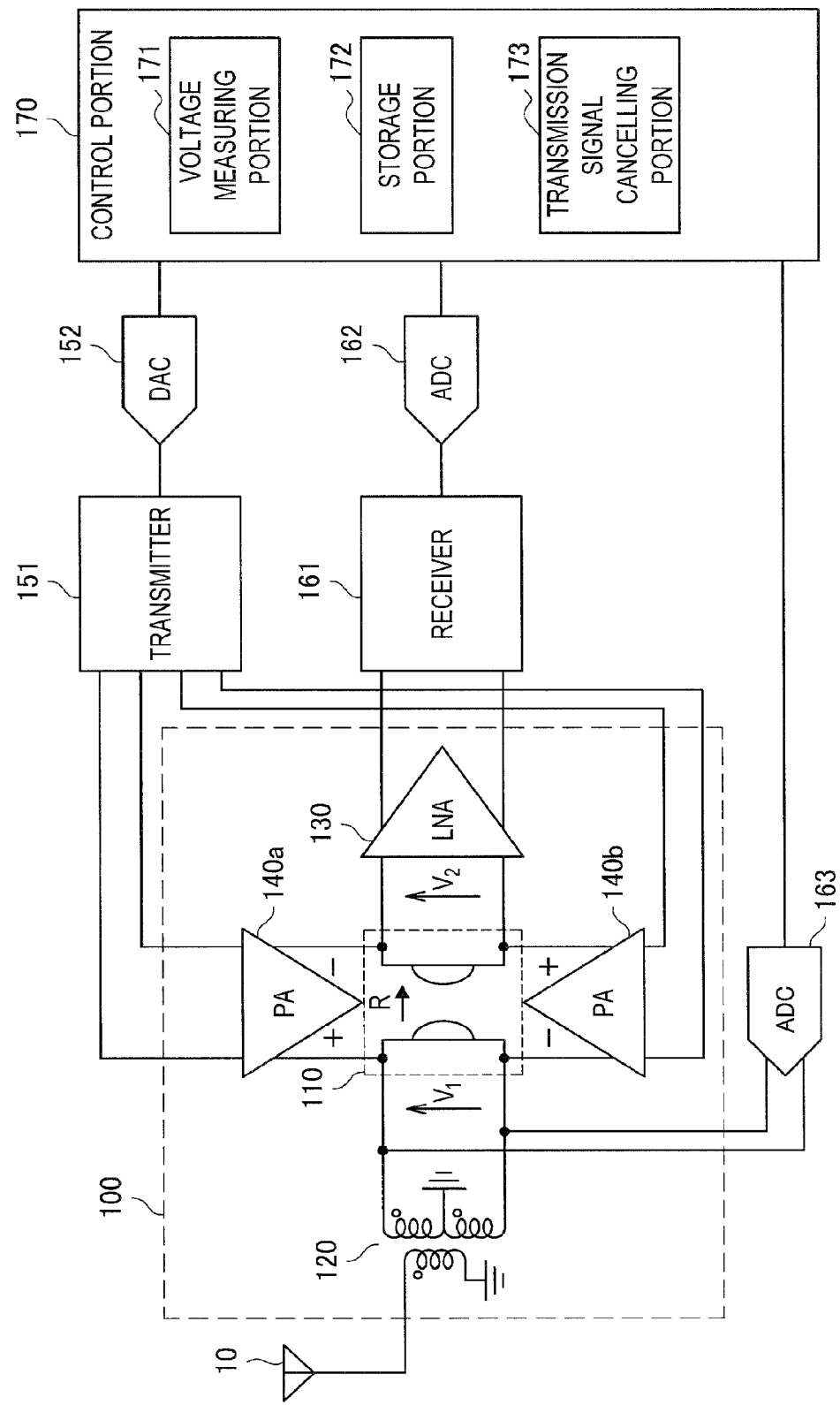
FIG. 13 is an explanatory drawing that shows a configuration example of the full-duplex wireless communication transceiver according to the fifth exemplary embodiment of the embodiment of the present disclosure.
Figure 14:
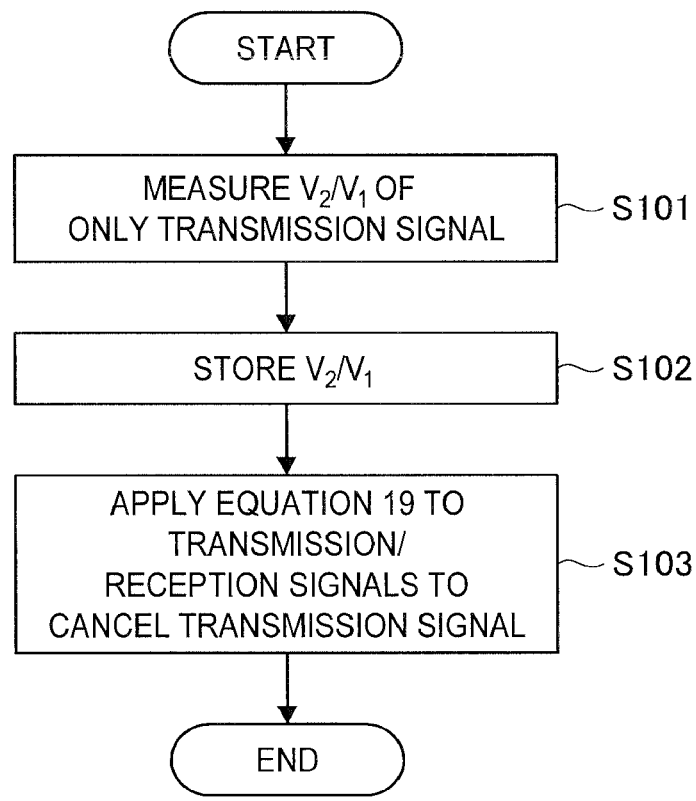
FIG. 14 is an explanatory drawing that shows an operation example of the full-duplex wireless communication transceiver according to the fifth exemplary embodiment of the embodiment of the present disclosure.

FIG. 13 is an explanatory drawing that shows a configuration example of a full-duplex wireless transceiver according to the fifth exemplary embodiment of the embodiment of the present disclosure. In FIG. 13, a full-duplex wireless transceiver is shown in which a transmitter 151, a DA converter 152, a receiver 161, AD converters 162 and 163, and a control portion 170 are added to the RF front end 100 shown in FIG. 3.

The transmitter 151 supplies transmission signals to the RF front end 100. The DA converter 152 converts the digital transmission signals generated by the control portion 170 to analog transmission signals and outputs them to the transmitter 151. Also, the receiver 161 receives the reception signals output from the differential LNA 130 of the RF front end 100, performs a predetermined reception processing, and outputs them to the AD converter 162. The AD converter 162 converts the analog reception signals that the receiver 161 has output to digital reception signals and outputs them to the control portion 170. Also, the AD converter 163 converts the terminal voltage $V_1$ of the antenna 10 during signal reception (the voltage across the first terminal and second terminal of the gyrator 110) to a digital signal and outputs it to a base-band physical layer 170.

The control portion 170 is a layer that executes various processes of the base band and for example executes various signal processes such as a modulation process and demodulation process of a signal, and an error correction process. As shown in FIG. 13, the control portion 170 is configured to include a voltage measuring portion 171, a storage portion 172, and a transmission signal cancelling portion 173.

The voltage measuring portion 171 acquires the terminal voltage $V_1$ of the antenna 10 during signal reception and the voltage $V_2$ (the voltage across the third terminal and fourth terminal of the gyrator 110) during signal reception, and measures the value of $V_2/V_1$. The storage portion 172 stores various kinds of information. In the present embodiment, the voltage measuring portion 171 stores the value of the measured $V_2/V_1$.

The transmission signal cancelling portion 173, using the value of $V_2/V_1$ that the voltage measuring portion 171 has measured and that has been stored in the storage portion 172, performs the operation of the aforementioned Equation 19, and cancels the transmission signal contained in the reception signal.

The full-duplex wireless communication transceiver according to the fifth exemplary embodiment of the embodiment of the present disclosure, by having the constitution shown in FIG. 13, is capable of improving the isolation characteristic.

Hereinabove, a configuration example of the full-duplex wireless communication transceiver according to the fifth exemplary embodiment of the embodiment of the present disclosure was described using FIG. 12. Now, an operation example of the full-duplex wireless communication transceiver according to the fifth exemplary embodiment of the embodiment of the present disclosure will be described.

FIG. 13 is a flowchart that shows an operation example of the full-duplex wireless communication transceiver according to the fifth exemplary embodiment of the embodiment of the present disclosure. Hereinbelow, an operation example of the full-duplex wireless communication transceiver according to the fifth exemplary embodiment of the embodiment of the present disclosure will be described using FIG. 13.

The flowchart shown in FIG. 13 is an operation example of when the control portion 170 performs the operation of cancelling a transmission signal contained in a reception signal. The full-duplex wireless communication transceiver according to the fifth exemplary embodiment first measures the value of $V_2/V_1$ of only the transmission signal with the voltage measuring portion 171 (Step S101).

When the value of $V_2/V_1$ of only the transmission signal has been measured with the voltage measuring portion 171, then the full-duplex wireless communication transceiver according to the fifth exemplary embodiment stores the value of $V_2/V_1$ of only the transmission signal that the voltage measuring portion 171 has measured in the storage portion 172 (Step S102).

When the value of $V_2/V_1$ of only the transmission signal has been stored in the storage portion 172, the transmission signal cancelling portion 173, using the value of $V_2/V_1$ of only the transmission signal stored in the storage portion 172, performs the operation of the aforementioned Equation 19 that cancels the transmission signal contained in the reception signal (Step S103).

The full-duplex wireless communication transceiver according to the fifth exemplary embodiment of the embodiment of the present disclosure, by executing the series of operations shown in FIG. 13, is capable of improving the isolation characteristic. Above, an operation example of the full-duplex wireless communication transceiver according to the fifth exemplary embodiment of the embodiment of the present disclosure was described using FIG. 13

Note that while the aforementioned fifth exemplary embodiment was shown as a configuration example for performing the operation of cancelling the transmission signal contained in the reception signal for the RF front end 100 shown in FIG. 3, the present disclosure is not limited to that example. That is, a constitution for performing the operation of cancelling the transmission signal contained in the reception signal may also be added to the RF front end 100 shown in the aforementioned second to fourth exemplary embodiments.

2. CONCLUSION

As described above, according to the embodiment of the present disclosure, it is possible to provide a RF front end capable of separating transmission signals and reception signals with one gyrator, and a full-duplex wireless communication transceiver provided with the RF front end.

Since it is possible to mount a gyrator that separates transmission signals and reception signals in an integrated chip, the RF front end according to the embodiment of the present disclosure can be constituted in a small size. Since it is possible to constitute the RF front end according to the embodiment of the present disclosure in a small size, even if the frequency bands that it must be compatible with increase, there is no major impact on the circuit scale. Also, since the RF front end according to the embodiment of the present disclosure is capable of separating transmission signals and reception signals with one gyrator, it is possible to suppress power consumption and inhibit degradation of the signal separation characteristic due to variations in the transconductance coefficient.

Steps in processes executed by devices in this specification are not necessarily executed chronologically in the order described in a sequence chart or a flow chart. For example, steps in processes executed by devices may be executed in a different order from the order described in a flow chart or may be executed in parallel.

Further, a computer program can be created which causes hardware such as a CPU, ROM, or RAM, incorporated in each of the devices, to function in a manner similar to that of structures in the above-described devices. Furthermore, it is possible to provide a recording medium having the computer program recorded thereon. Moreover, by configuring respective functional blocks shown in a functional block diagram as hardware, the hardware can achieve a series of processes.

The preferred embodiment(s) of the present disclosure has/have been described above with reference to the accompanying drawings, whilst the present disclosure is not limited to the above examples, of course. A person skilled in the art may find various alterations and modifications within the scope of the appended claims, and it should be understood that they will naturally come under the technical scope of the present disclosure.

In addition, the effects described in the present specification are merely illustrative and demonstrative, and not limitative. In other words, the technology according to the present disclosure can exhibit other effects that are evident to those skilled in the art along with or instead of the effects based on the present specification.

Additionally, the present technology may also be configured as below.

(1)

A wireless communication apparatus including:

a gyrator that includes at least four terminals and that transmits signals in one direction;

a single-phase differential converter that mutually converts single-phase signals and differential signals;

a low-noise amplifier that amplifies reception signals that the gyrator outputs; and a power amplifier that amplifies transmission signals to be output to the gyrator, wherein the gyrator transmits signals from a first terminal and a second terminal in the direction of a third terminal and a fourth terminal, and wherein any of the single-phase differential converter, the low-noise amplifier, and the power amplifier are connected to the first terminal and second terminal, the third terminal and fourth terminal, the first terminal and third terminal, and the second terminal and fourth terminal of the gyrator.

(2)

The wireless communication apparatus according to (1), wherein differential signal input and output sides of the single-phase differential converter are connected to the first terminal and second terminal of the gyrator, input terminals of the low-noise amplifier are connected to the third terminal and fourth terminal of the gyrator, and output terminals of the power amplifiers are respectively connected to the first terminal and third terminal and to the second terminal and fourth terminal.

(3)

The wireless communication apparatus according to (2), wherein output voltages of the power amplifiers respectively connected to the first terminal and third terminal and to the second terminal and fourth terminal of the gyrator are summed in-phase at the gyrator.

(4)

The wireless communication apparatus according to (2) or (3), wherein terminal impedance between the first terminal and second terminal of the gyrator and terminal impedance between the third terminal and fourth terminal are configured so as to be equal to the inverse of a differential transconductance coefficient of the gyrator.

(5)

The wireless communication apparatus according to (2) or (3), wherein terminal impedance between the first terminal and third terminal of the gyrator and terminal impedance between the second terminal and fourth terminal are configured so as to be equal to half of the inverse of a differential transconductance coefficient of the gyrator.

(6)

The wireless communication apparatus according to any of (2) to (5), further including:

a voltage calculating portion that calculates a value that is a voltage value between the third terminal and fourth terminal of the gyrator divided by a voltage value between the first terminal and second terminal of the gyrator when a reception signal is transmitted to the gyrator; and a cancelling portion that cancels a transmission signal component from the reception signal using the value calculated by the voltage calculating portion.

(7)

The wireless communication apparatus according to (6), wherein the cancelling portion cancels a transmission signal component from the reception signal by removing an open circuit output voltage component of the power amplifier from voltage between the third terminal and fourth terminal of the gyrator.

(8) The wireless communication apparatus according to (1), wherein output terminals of the power amplifier are connected to the first terminal and second terminal of the gyrator, differential signal input and output sides of the single-phase differential converter are connected to the third terminal and fourth terminal of the gyrator, and input terminals of the low-noise amplifiers are respectively connected to the first terminal and third terminal and to the second terminal and fourth terminal.

(9) The wireless communication apparatus according to (1), wherein input terminals of the low-noise amplifier are connected to the first terminal and second terminal of the gyrator, output terminals of the power amplifier are connected to the third terminal and fourth terminal of the gyrator, and differential signal input and output sides of the single-phase differential amplifiers are respectively connected to the first terminal and third terminal and to the second terminal and fourth terminal of the gyrator.

(10) The wireless communication apparatus according to any of (1) to (9), wherein the gyrator is constituted by a plurality of single-phase inverters.

(11) The wireless communication apparatus according to (10), wherein a transconductance coefficient of each single-phase inverter is configured so as to be equal to twice a differential transconductance coefficient of the gyrator.

REFERENCE SIGNS LIST

100 RF front end
110 gyrator
120, 120a, 120b balun
130, 130a, 130b differential LNA
140, 140a, 140b differential PA

The invention claimed is:

1. A wireless communication apparatus comprising:
   a gyrator that includes at least a first, a second, a third, and a fourth terminal;
   a single-phase to differential converter that mutually converts single-phase signals and differential signals;
   a low-noise amplifier that amplifies reception signals that the gyrator outputs; and
   a power amplifier that amplifies transmission signals to be output to the gyrator,
   wherein the gyrator receives signals from the first and the second terminals in the direction of the third and the fourth terminals, and
   wherein each of the single-phase to differential converter, the low-noise amplifier, and the power amplifier is connected to one of the pairs of
   the first and second terminals,
   the third and fourth terminals,
   the first and third terminals, or
   the second and fourth terminals of the gyrator.

2. The wireless communication apparatus according to claim 1,
   wherein the power amplifier comprises two power amplifiers, and differential terminals of the single-phase to differential converter are connected to the first and second terminals of the gyrator, input terminals of the low-noise amplifier are connected to the third and fourth terminals of the gyrator, and output terminals of the power amplifiers are respectively connected to the first and third terminals and to the second and fourth terminals.

3. The wireless communication apparatus according to claim 2,
   wherein output voltages of the power amplifiers are summed in-phase at the gyrator.

4. The wireless communication apparatus according to claim 2,
   wherein terminal impedance between the first and second terminals of the gyrator and terminal impedance between the third and fourth terminals are configured so as to be equal to the inverse of a differential transconductance coefficient of the gyrator.

5. The wireless communication apparatus according to claim 2,
   wherein terminal impedance between the first and third terminals of the gyrator and terminal impedance between the second and fourth terminals are configured so as to be equal to half of the inverse of a differential transconductance coefficient of the gyrator.

6. The wireless communication apparatus according to claim 2, further comprising:
   a voltage calculating portion that calculates a value that is a voltage value between the third and fourth terminals of the gyrator divided by a voltage value between the first and second terminals of the gyrator when a reception signal is transmitted to the gyrator; and
   a cancelling portion that cancels a transmission signal component from the reception signal using the value calculated by the voltage calculating portion.

7. The wireless communication apparatus according to claim 6,
   wherein the cancelling portion cancels a transmission signal component from the reception signal by removing an open circuit output voltage component of the two power amplifiers from voltage between the third and fourth terminals of the gyrator.

8. The wireless communication apparatus according to claim 1,
   wherein the low-noise amplifier comprises two low-noise amplifiers, and output terminals of the power amplifier are connected to the first and second terminals of the gyrator, differential terminals of the single-phase to differential converter are connected to the third and fourth terminals of the gyrator, and input terminals of the low-noise amplifiers are respectively connected to the first and third terminals and to the second and fourth terminals.

9. The wireless communication apparatus according to claim 1,
   wherein the single-phase to differential converter comprises two single-phase to differential converters, and input terminals of the low-noise amplifier are connected to the first and second terminals of the gyrator, output terminals of the power amplifier are connected to the third and fourth terminals of the gyrator, and differential terminals of the single-phase to differential converters are respectively connected to the first and third terminals and to the second and fourth terminals of the gyrator.

10. The wireless communication apparatus according to claim 1, wherein the gyrator is constituted by a plurality of single-phase inverters.

11. The wireless communication apparatus according to claim 10, wherein a respective transconductance coefficient of each single-phase inverter is configured so as to be equal to twice a differential transconductance coefficient of the gyrator.

\* \* \* \* \*